United States Patent [19]
Hekimian

[11] 3,961,255
[45] June 1, 1976

[54] MEASUREMENT BANDWIDTH ENHANCEMENT IN PHASE LOCK LOOPS

[75] Inventor: Norris C. Hekimian, Rockville, Md.

[73] Assignee: Hekimian Laboratories, Inc., Rockville, Md.

[22] Filed: Aug. 15, 1974

[21] Appl. No.: 497,817

[52] U.S. Cl. .............................. 324/83 R; 331/18; 325/42
[51] Int. Cl.² ........................................ G01R 25/00
[58] Field of Search ............ 324/83 R; 331/1 R, 18, 331/25; 307/273; 328/207; 325/42, 67, 421

[56] References Cited
UNITED STATES PATENTS

| | | | |
|---|---|---|---|
| 3,181,122 | 4/1965 | Brown.................................. | 331/18 |
| 3,546,588 | 12/1970 | Campbell............................. | 325/42 |
| 3,806,827 | 4/1974 | Standke............................... | 331/18 |

*Primary Examiner*—R. V. Rolinec
*Assistant Examiner*—Michael J. Tokar
*Attorney, Agent, or Firm*—Rose & Edell

[57] ABSTRACT

In a phase lock loop, the bandwidth of the phase error signal, when used for phase measurement outside the loop, is increased by summing the error signal with an integrated version of the VCO control signal derived from the loop filter circuit. The combined effect on the error signal of both the loop filter circuit and the integration provides a boost effect at low frequencies, which when summed with the unprocessed error signal results in a broadband measurement signal with a low frequency cut-off below the low-frequency cut-off of the loop itself. This technique permits extending the bandwidth of the measurement signal without affecting loop operation.

9 Claims, 1 Drawing Figure

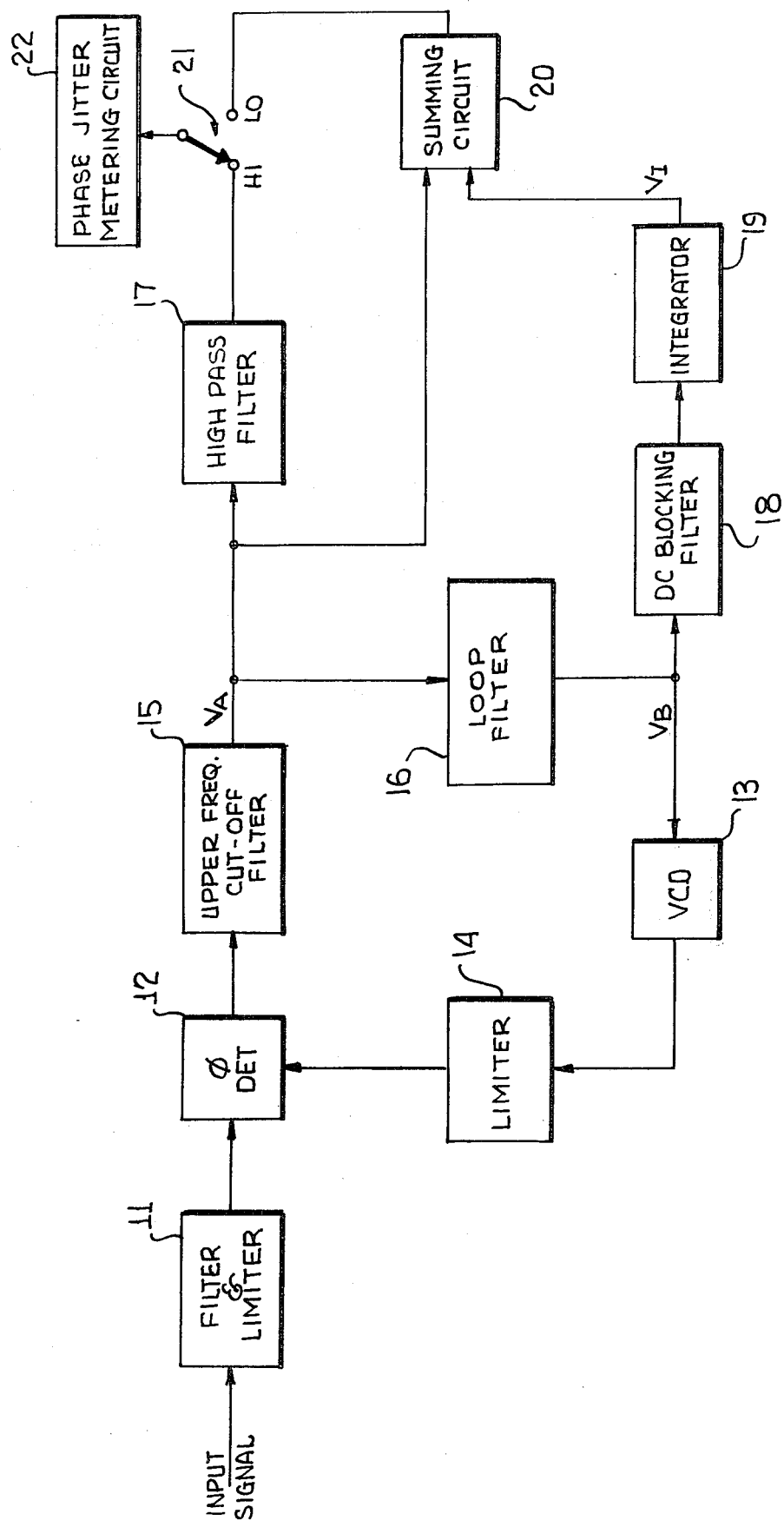

MEASUREMENT BANDWIDTH ENHANCEMENT IN PHASE LOCK LOOPS

BACKGROUND OF THE INVENTION

The present invention relates to feedback control loops of the type wherein the loop error signal is measured. More particularly, the invention relates to increasing the effective bandwidth of the phase error signal in a phase lock loop.

It is known in the prior art to utilize the phase error signal in a phase lock loop as a measure of phase jitter appearing on an input signal. As examples of this technique, reference is made to U.S. Pat. Nos. 3,546,588 (to Campbell, Jr.) and 3,711,773 (to Hekimian et al). The phase error or measurement signal is derived from the loop phase detector and provides measure of phase modulation of the loop input signal over a band of phase modulation frequencies determined by the loop bandwidth. This loop bandwidth is normally designed as a compromise between optimum acquisition to achieve phase lock and optimum tracking to maintain phase lock. Specifically, acquisition is most optimally effected with a wide loop bandwidth wherein the loop can virtually instantaneously lock onto the signal; tracking, once phase lock is achieved, is most efficiently performed in a narrow band loop. Hence, there is a need for compromise in selecting loop bandwidth.

Quite often it is desirable to be able to measure phase jitter at phase modulation frequencies below the low frequency cut-off of the loop passband. One approach to doing this would be to re-design the loop to include the lower frequencies in the loop passband; however, this destroys the compromise referred to above and adversely affects the reliability of the loop operation in the tracking mode. Other possibilities exist, but they involve use of complex circuits and attendent cost increase.

It is therefore a primary object of the present invention to provide a simple and inexpensive technique for measuring phase jitter in a frequency band extending below the low frequency cut-off of a phase lock loop bandwidth without affecting loop operation or design.

It is another object of the present invention to provide a circuit which permits phase jitter measurement to be extended to phase modulation frequencies residing outside the bandwidth of a phase lock loop from which the measurement signal is derived.

In a broader context, it is an object of the present invention to provide a technique wherein the bandwidth of the error signal in a feedback loop can be expanded to frequencies below the low frequency cut off of the loop bandwidth without affecting loop operation.

SUMMARY OF THE INVENTION

According to the present invention, the phase error signal, derived from the phase detector in a phase lock loop, is summed with an integrated version of the VCO-controlling signal derived from the loop filter circuit. The combined effects of the loop filter and integrator provides an enhanced low frequency response which, when summed with phase error signal, provides a phase jitter measurement signal with a bandwidth extending below the low frequency cut-off of the loop itself. Loop operation remains unaffected in spite of the fact that part of the low frequency enhancement is derived from the loop filter.

BRIEF DESCRIPTION OF THE DRAWING

The above and still further objects, features and advantages of the present invention will become apparent upon consideration of the following detailed description of one specific embodiment thereof, especially when taken in conjunction with the accompanying drawing, wherein:

The single FIGURE is a functional block diagram of a phase lock loop employing the measurement bandwidth enhancement technique of the present invention.

DESCRIPTION OF THE PREFERRED EMBODIMENT

Referring to the drawing in greater detail, the illustrated circuit has as one of its functions the measurement of phase jitter appearing on the INPUT SIGNAL. The INPUT SIGNAL itself has a regular wave form (such as sinusoid, square wave, triangular wave, etc.) which is amplitude-limited and filtered at circuit 11 to provide a square wave at known nominal frequency. This signal is in turn applied to one input terminal of a phase detector 12 which may, for example, be an exclusive-OR gate as described in the aforementioned U.S. Pat. No. 3,711,773. The other input terminal of phase detector 12 receives a signal from voltage-controlled oscillator (VCO) 13 via limiter circuit 14. VCO 13 provides a signal of regular waveform at the same nominal frequency as the INPUT SIGNAL. Limiter 14 amplitude-limits the VCO signal to provide a square wave at the phase detector.

If phase detector 12 is an exclusive-OR gate, its output signal is a square wave of frequency twice the nominal frequency of the INPUT SIGNAL and VCO. The duty cycle of the phase detector output signal varies from 50% in proportion to variations from 90° in the phase difference between the input and VCO signals. Therefore the duty cycle of the phase detector output signal provides a measure of the phase displacement between the two signals. This phase detector output signal is applied to a filter circuit 15 which is a low pass filter having a high cut-off frequency which is below the nominal frequency of the INPUT and VCO signals. Filter 15 therefore passes phase variations of interest but blocks the signal frequency. The effect is a duty cycle-to-DC conversion wherein the varying DC level follows INPUT signal phase variations.

The phase error signal from filter 15 is applied to the loop filter network 16 which has a low pass characteristic to limit the frequency response of VCO 13. Specifically, network 16 would typically have a high cut-off on the order of 5 Hz and thereby prevents the VCO from responding to short term input signal phase variations of less than 200 milliseconds duration. Shorter phase variations are in the nature of impulse noise which is measured by other equipment. The output signal from loop delay circuit is applied to VCO 13 to control the phase of the VCO output signal accordingly.

The circuit as thus far described, including elements 11–16, is conventional and well known. The VCO tracks INPUT SIGNAL phase variations, and the phase error signal provided by phase detector 12, through filter 15, serves as a phase measurement signal. As noted previously, filter 15 defines the upper frequency limit of the bandwidth of this phase measurement signal; the low frequency limit for the signal is somewhat higher than DC. This latter fact may best be understood by considering the INPUT SIGNAL phase as changing suddenly and then remaining at that new phase. The loop acts to change the VCO phase accordingly until the output signal from the phase detector has a 50% duty cycle and the output signal from filter 15 is at zero level. In other words, there is no DC response. In fact, the low frequency cut-off is typically on the order of 20 Hz, below which there is a heavily attenuated response at the output signal of filter 15. It is conventional to apply this signal to phase jitter metering circuitry through a high pass filter 17. Filter 17 has a low cut-off frequency (typically 10 Hz) below the low frequency cut-off of the signal from filter 15 and serves primarily to eliminate any DC component introduced by amplifier bias levels, etc. The signal passed to metering circuitry 22 from filter 17 therefore has a bandwidth which is limited at its low end by the low frequency cut-off of the phase lock loop bandwidth.

In order to permit phase jitter measurement at phase modulation frequencies below the loop cut-off frequency (i.e., in order to extend the low frequency response of the phase jitter measurement), I employ an integrator circuit 19 and summing circuit 20. Specifically, integrator 19 operates on the VCO control signal supplied by the loop filter 16. As illustrated, a high pass DC blocking filter, with a low frequency cut-off on the order of 1 or 2 Hz, may be employed to eliminate DC from the measurement. Integrator 19 is preferably not a pure integrator but instead would have a low pass response up to a few Hertz and a 6 db per octave roll off thereafter. This permits the operating point of the integrator to be determined. The output signal from integrator 19 is summed with the conventional phase measurement signal (from filter 15) at summing circuit 20. The summed output signal is applied through switch 21 to metering circuits 22. Switch 21, as shown, is connected to select the output signal from either of filter 17 or summing circuit 20 for metering.

The significance of this technique for enhancing the low frequency response of the measurement signal is the fact that advantage is taken of the low frequency "boost" provided by network 16 yet loop operation is in no way affected. This low frequency "boost" is further enhanced by the low frequency response characteristic of integrator 19. When this signal with a boosted low frequency response is summed with the phase error signal at circuit 20, the resulting signal has a wideband response corresponding to the bandwidth of the original error signal increased at its low end by the low frequency boost circuits. This can be illustrated mathematically by the following analysis wherein the effect of filter 15 is ignored because it affects the high frequency end of the passband which is not of interest.

The phase lock loop, by virtue of the presence of filter circuit 16 and VCO 13 (which acts an an integrator in the sense that the phase of its output signal is proportional to the integral of the applied control voltage), is a second order loop. The transfer function of a second order loop may be represented as follows:

$$\frac{\phi_{VCO}}{\phi_{IN}} = \frac{K_1 H(s)}{s + K_1 H(s)} \tag{1}$$

wherein: $\phi_{VCO}$ is the phase of the VCO output signal; $\phi_{IN}$ is the phase of the INPUT SIGNAL, $H(s)$ is the transfer function of the feedback path, considered here to be lumped in filter circuit 16; $K_1$ is a constant dependent upon circuit components; $s$ is a mathematical operator equal to $j\omega$; and $\omega$ is frequency in radians. If the output signal amplitude from filter 15 is designated $V_A$, then $$V_A = K_\phi \ (\phi_{IN} - \phi_{VCO}), \tag{2}$$

wherein $K_\phi$ is a constant dependent upon the phase detector characteristic. Expression (2) can be rearranged to yield:

$$\frac{V_A}{\phi_{IN}} = K_\phi \ \left(1 - \frac{\phi_{VCO}}{\phi_{IN}}\right). \tag{3}$$

Substituting from expression (1) into expression (3) and simplifying, $$\frac{V_A}{\phi_{IN}} = K_\phi \ \left(\frac{s}{s + K_1 H(s)}\right). \tag{4}$$

If the output signal from network 16 is designated $V_B$, then $$V_B = V_A H(S). \tag{5}$$

and dividing both sides through by $\phi_{IN}$ yields:

$$\frac{V_B}{\phi_{IN}} = \frac{V_A}{\phi_{IN}} H(s). \tag{6}$$

Substituting expression (4) for $V_A/\phi_{IN}$ in expression (6), $$\frac{V_B}{\phi_{IN}} = K_\phi \ \left(\frac{s H(s)}{s + K_1 H(s)}\right). \tag{7}$$

If $V_B$ is integrated (as it is by integrator $V_I$), the output signal $V_I$ from the integrator is represented by dividing $V_B$ by $s$. Therefore, from expression (7), $$\frac{V_I}{\phi_{IN}} = K_\phi \ K_I \ \left(\frac{H(s)}{s + K_1(s)}\right), \tag{8}$$

wherein $K_I$ is a constant dependent upon the integrator circuit components. Summing expression (4) with expression (8) to represent the function of circuit 20, $$\frac{V_I + V_A}{\phi_{IN}} = \frac{s + K_I H(s)}{s + K_1 H(s)}. \tag{9}$$

From expression (9), it is clear that the response is flat (i.e., unity) for all values of $s$ (i.e., all frequencies) if $K_I$ and $K_1$ are equal. This can be achieved by proper selection of integrator circuit constants. In fact, the selection is made so that integrator 19 matches the integrating characteristic of VCO 13.

It is noted that the illustrated circuit permits measurement of phase jitter within the limited loop bandwidth (in the HI position of switch 21). The additional bandwidth is achieved with minimum additional cost and circuitry since it makes use of the low frequency boost supplied by loop filter network 16. On the other hand, loop operation is completely unaffected by the additional circuitry.

It should also be noted that the technique described herein for phase lock loops can be employed in other type feedback loops wherein it is desired to extend the low frequency end of the measurement signal passband beyond the low frequency cut off of the loop response. In such a loop the phase detector would correspond to a comparator between the input and feedback signals, and the feedback signal would be controlled by the loop filter. The technique merely requires utilization of a circuit (to replace elements 18, 19) having a transfer characteristic which matches the transfer characteristic in feedback path between the loop filter 16 and the comparator 12. In second order loops, such as illustrated in the FIGURE, an integrator such as integrator 19 would be required because the feedback path in a second order loop would include an integrator such as VCO 13 (i.e. output phase is an integral function of input voltage). In a first order loop, no integrator would be required; rather a network having the same transfer function as the feedback path would be used.

While I have described and illustrated specific embodiments of my invention, it will be clear that variations of the details of construction which are specifically illustrated and described may be resorted to without departing from the true spirit and scope of the invention as defined in the appended claims.

I claim:

1. In a control loop of predetermined bandwidth and of the type wherein an input signal and feedback signal are compared to provide an error signal to a loop filter which in turn controls a feedback circuit which provided the feedback signal, a method of measuring said error signal over a bandwidth which extends to frequencies below the loop bandwidth, said method comprising the steps of:
   processing the output signal from said low pass loop filter through a circuit having a transfer characteristic which matches the transfer characteristic of said feedback circuit;
   summing the processed output signal with said error signal; and
   measuring the amplitude of the summed signals.

2. The method according to claim 1 wherein said loop is a phase lock loop and said error signal is a phase error signal representing phase variations in said input signal, said loop further comprising: a voltage controlled oscillator which provides said feedback signal at a frequency proportional to the amplitude of the output signal from said low pass loop filter; and wherein said processing involves integrating said output signal from said low pass filter.

3. The method according to claim 2 further comprising the step of alternatively metering said error signal and the summed signals.

4. A phase lock loop for providing a phase measurement signal indicative of phase jitter appearing on an input signal of predetermined nominal frequency, said loop being characterized in that said phase measurement signal has a frequency bandwidth with a low frequency cut off below the low frequency cut off of the loop bandwidth, said loop comprising:
   a voltage-controlled oscillator for providing a VCO signal which varies from said predetermined nominal frequency in proportion to the level of control voltage applied thereto;
   a phase comparator means for providing an error signal indicative of the phase difference between said input and VCO signals;
   low pass loop filter means responsive to said error signal for providing said control voltage to said voltage controlled oscillator;
   integrator means for integrating said control voltage; and
   summing means for summing the amplitudes of said error signal and said control voltage to provide said phase measurement signal.

5. The combination according to claim 4 further comprising:
   a metering circuit; and
   switch means for alternatively applying said error signal and said phase measurement signal to said metering circuit.

6. A control loop of the type which provides a measurement signal indicating variations in a predetermined parameter of an input signal, said loop being characterized in that its bandwidth has a low frequency cut-off which is higher than the low frequency cut-off of the measurement signal bandwidth, wherein said loop comprises:
   comparator means arranged to receive two signals and provide an error signal having an amplitude proportional to the difference in said predetermined parameter between said two signals;
   loop filter means responsive to said error signal for providing a control signal;
   feedback means having a predetermined transfer function responsive to said control signal for providing a feedback signal;
   means for applying said feedback signal to said comparator means as one of said two signals;
   means for applying said input signal to said comparator as the other of said two signals;
   circuit means having the same transfer function as said feedback means for passing signals passed by said filter means to provide a first voltage; and
   summing means for summing said first voltage with said error signal amplitude to provide said measurement signal.

7. The loop according to claim 6 further comprising:
   a metering circuit; and
   switch means for alternatively applying said measurement signal and said error signal to said metering circuit.

8. The loop according to claim 6 wherein said predetermined parameter is phase, wherein said feedback means includes a voltage controlled oscillator connected to receive and be controlled by said signals passed by said low pass loop filter means, and wherein said comparator means is a phase detector.

9. The combination according to claim 5 wherein said integrator means has a transfer characteristic which matches the transfer characteristic of said voltage controlled oscillator.

* * * * *